(12) United States Patent (10) Patent No.: US 10,146,090 B2
Siddiqui et al. (45) Date of Patent: Dec. 4, 2018

(54) MINIMIZING BORDER OF A DISPLAY DEVICE

(71) Applicant: Microsoft Technology Licensing, LLC, Redmond, WA (US)

(72) Inventors: Kabir Siddiqui, Sammamish, WA (US); Ying Zheng, Redmond, WA (US); Rajesh Dighde, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/225,687

(22) Filed: Aug. 1, 2016

(65) Prior Publication Data

US 2018/0031879 A1 Feb. 1, 2018

(51) Int. Cl.
*G02F 1/1339* (2006.01)
*H05B 33/04* (2006.01)
*H05B 33/10* (2006.01)
*G02F 1/1333* (2006.01)
*H01L 51/52* (2006.01)

(52) U.S. Cl.
CPC ........ *G02F 1/1339* (2013.01); *G02F 1/13336* (2013.01); *G02F 1/133308* (2013.01); *G02F 1/133351* (2013.01); *H01L 51/5246* (2013.01); *H05B 33/04* (2013.01); *H05B 33/10* (2013.01); *G02F 2001/133331* (2013.01); *G02F 2202/28* (2013.01); *H01L 2251/566* (2013.01)

(58) Field of Classification Search
CPC .................................................. G02F 1/1339
See application file for complete search history.

(56) References Cited

U.S. PATENT DOCUMENTS

| 5,376,561 | A | 12/1994 | Vu et al. |
| 7,952,107 | B2 | 5/2011 | Daniels et al. |
| 8,804,347 | B2 | 8/2014 | Martisauskas |

(Continued)

FOREIGN PATENT DOCUMENTS

| CN | 104518176 A | 4/2015 |
| EP | 1811587 A2 | 7/2007 |
| WO | 2015038848 A1 | 3/2015 |

OTHER PUBLICATIONS

"International Search Report and Written Opinion Issued in PCT Application No. PCT/US2017/043575", dated Oct. 23, 2017, 13 Pages.

(Continued)

*Primary Examiner* — Edmond C Lau
(74) *Attorney, Agent, or Firm* — Lempia Summerfield Katz LLC (57) ABSTRACT

Display devices with a minimized border and methods of manufacturing display devices are described herein. In one example, a display unit is provided, the display unit having a display active area disposed between an encapsulation layer and a substrate such that the encapsulation layer encloses the display active area between a surface of the encapsulation layer and a surface of the substrate. A section of the display unit is cut at one edge of the display unit such that a portion of the encapsulation layer and a portion of the substrate are removed from the display unit while no display active area is removed. The cut section of the display unit is then sealed.

11 Claims, 9 Drawing Sheets

(56) References Cited

U.S. PATENT DOCUMENTS

| | | | |
|---|---|---|---|
| 9,025,111 B2 | 5/2015 | Teller et al. | |
| 2004/0233379 A1* | 11/2004 | Kinoshita | G02F 1/1341 |
| | | | 349/158 |
| 2007/0222937 A1 | 9/2007 | Lee et al. | |
| 2008/0198584 A1 | 8/2008 | Fouraux et al. | |
| 2010/0220472 A1 | 9/2010 | Dahm | |
| 2011/0260949 A1* | 10/2011 | Ahn | H01J 11/12 |
| | | | 345/1.3 |
| 2012/0112238 A1 | 5/2012 | Mirsky et al. | |
| 2014/0036204 A1 | 2/2014 | Doyle et al. | |
| 2014/0049983 A1 | 2/2014 | Nichol et al. | |
| 2014/0333868 A1* | 11/2014 | Tannas, Jr. | G02F 1/1339 |
| | | | 349/58 |
| 2014/0364043 A1 | 12/2014 | Lancaster-Larocque et al. | |
| 2015/0125227 A1 | 5/2015 | Muller et al. | |

OTHER PUBLICATIONS

Garner, et al., "Ultra-slim flexible glass for roll-to-roll electronic device fabrication", In Journal of Applied Physics A, vol. 116, Issue 2, May 15, 2014, pp. 1-7.

* cited by examiner

MINIMIZING BORDER OF A DISPLAY DEVICE

BACKGROUND

Current design trends for electronic such as tablet computers, display devices, or mobile phones include designs having an increase in power, a decrease in size (e.g., height, length, and/or width), and an increase in speed. As the size of the electronic device is reduced, certain internal device components may be positioned closer together. This provides for challenges in manufacturing design.

For example, a conventional display device may include an unnecessarily large border around one or more edges of the display device. There are manufacturing challenges in reducing the edge of a display device such that certain internal components of the display device (e.g., light emitting diode or liquid crystal pixels) are as close to an edge or border of a display as possible, therein reducing the overall size of the electronic device without reducing the size of the display area of the device.

SUMMARY

Display devices with a minimized border and methods of manufacturing display devices are described herein. In one or more embodiments, the method includes providing a display unit of the electronic device, wherein the display unit has a display active area disposed between an encapsulation layer and a substrate such that the encapsulation layer encloses the display active area between a surface of the encapsulation layer and a surface of the substrate. The method further includes cutting a section of the display unit at one edge of the display unit such that a portion of the encapsulation layer and a portion of the substrate are removed from the display unit while no display active area is removed. The method further includes sealing the cut section of the display unit.

In another embodiment, the method includes providing a display unit of the electronic device having a display active area disposed between a transparent cover and a substrate. The method further includes cutting the display unit into a plurality of sections between pixels of the display active area, each section having at least one cut edge. The method further includes sealing a cut edge of at least one section of the plurality of sections.

In another embodiment, an electronic device is provided. The electronic device includes a transparent cover, a substrate, and a display unit disposed between the transparent cover and the substrate. The display unit includes a display active area and at least one cut edge configured to minimize a distance between the display active area of the at least one cut edge, and the at least one cut edge is sealed with a sealant.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DESCRIPTION OF THE DRAWING FIGURES

For a more complete understanding of the disclosure, reference is made to the following detailed description and accompanying drawing figures, in which like reference numerals may be used to identify like elements in the figures.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein.

DETAILED DESCRIPTION

Disclosed herein are electronic devices and systems with a minimized border and methods of manufacturing such devices and systems. A device with a minimized border may be advantageous for any electronic device having a display screen. In other words, the devices, systems, and methods disclosed herein are beneficial and advantageous over conventional display devices as the improved devices may provide an overall reduced size for the electronic device without reducing the size of the display area of the electronic device.

Such an electronic device having a display unit or screen with a minimized border may include a television, computer monitor, laptop or mobile computer, tablet computer, handheld computing device, communication device such as a mobile phone or smartphone, or any other electronic device having a display screen. In some examples, the electronic device is a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Non-limiting examples of electronic devices with reduced or minimized borders, and their methods of making, are described in greater detail below.

Figure 1:
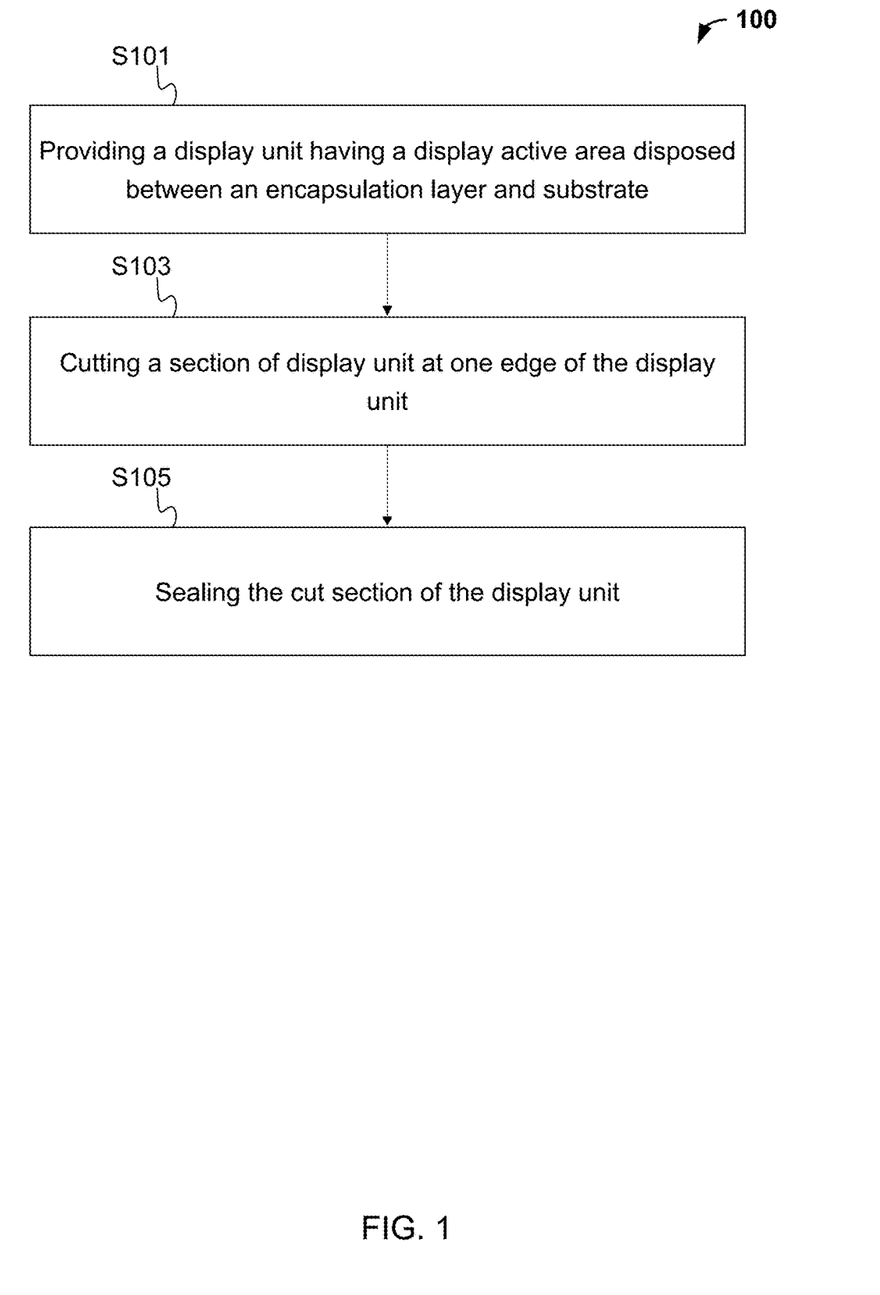
FIG. 1 depicts an example flowchart for reducing a border of a display unit of an electronic device.

FIG. 1 depicts an example flowchart for reducing a border of a display unit of an electronic device. As noted above, the electronic device may be any electronic device having a display unit or display screen.

In act S101, a display unit of an electronic device is provided. The display unit may include a display active area disposed between an encapsulation layer and a substrate. The display active area may include a liquid crystal display (LCD) unit and backlight unit. In other examples, the display active area includes a light emitting diode (LED) unit or an organic light emitting diode (OLED) unit. The display unit may be configured as a display module stack. The display module stack may include any number of optical layers or films. Each layer of the display unit may be structurally supported by the substrate or an internal support layer.

The encapsulation layer is configured to enclose or cover the display active area between a surface (e.g., an internal surface) of the encapsulation layer and a surface (e.g., an internal surface) of the substrate. This is advantageous in providing a barrier for the display active area, therein protecting the display active area from external contaminants such as moisture (e.g., humidity), oxygen, dust, or chemicals (e.g., organic solvents). The encapsulation layer may be a rigid or flexible material. The encapsulation layer may be made of any material or composition capable of providing a protective barrier to the underlying display active area. For example, the encapsulation layer may be made of glass, plastic, or polymers. In certain examples, the composition of the encapsulation layer does not include any organic solvents. Alternatively, or additionally, the composition does not support a static electric charge (which may damage the display active area such as an OLED unit). The encapsulation layer may include a plurality of layers, and may alternate between organic polymer composition layers and inorganic oxide composition layers.

The thickness or height of the encapsulation layer (e.g., as measured in a direction perpendicular to the plane in which the layer is positioned) is variable. In certain examples, the thickness is in a range of 10-1000 nanometers (nm), or 100-500 nm.

The substrate may be disposed in a plane parallel with the encapsulation layer to sandwich or protect the display active area in between the encapsulation layer and substrate. Like the encapsulation layer, the substrate may be made of a composition configured to protect the display active area from external contaminants. The substrate may be made of a similar or different composition from the encapsulation layer. In certain examples, the substrate composition is a glass, plastic, or polymer.

The substrate may also be configured to support the display active area. In such examples, the substrate may be a rigid composition. The thickness or height of the substrate (e.g., as measured in a direction perpendicular to the plane in which the substrate is positioned) is variable. In certain examples, the thickness is in a range of 10-1000 micrometers or 100-500 micrometers.

The display unit of the electronic device may include additional layers or components in addition to the encapsulation layer, the display active area, and the substrate. For example, an adhesive layer may be positioned between the encapsulation layer and display active area, or between the display active area and substrate in order to secure the neighboring layers to each other. An adhesive layer may alternatively, or additionally, be disposed on an external surface of the encapsulation layer or the substrate in order to secure the encapsulation layer or the substrate to an additional layer or component of the electronic device. In certain examples, the adhesive layers may include one or more pressure-sensitive adhesive materials. Additional or alternative types of adhesive materials and films may be used, including, for instance, moisture or thermally cured adhesive materials. The adhesive materials of the adhesive layers may be silicone-based, epoxy-based and/or acrylic-based materials.

In other examples, the display unit may include an internal electronics component positioned between the encapsulation layer and substrate, or on an outer surface of the encapsulation layer or substrate. The internal electronics component may include one or more of the following: a touch sensor unit, a vapor chamber, heat pipe, heat sink, heat fin, battery, processor, integrated circuit, or printed circuit board. The touch sensor unit may be made of any known or future developed material. In certain examples, the touch sensor unit may be made from indium tin oxide (ITO), metal mesh, carbon nanotubes, and combinations thereof.

In certain examples, the display unit is defined to include such an internal electronics component. In alternative examples, the electronic device is defined to include the display unit and the internal electronics component (i.e., separate from the display unit).

In act S103, a section of the display unit is removed to reduce the size of the display unit. For example, a section of the display unit is cut at one edge to remove a portion of the border. The location of the cut at the edge of the display unit is determined such that a portion of the encapsulation layer and a portion of the substrate are removed from the display unit while no display active area is removed. This is advantageous in reducing the size of the display unit and overall electronic device without reducing the size of the display active area (or display screen itself), or otherwise damaging the display active area. In some examples, more than one section of the display unit is removed. For instance, more than one edge is cut, and more than one border removed. In some examples, two, three, or four sections or edges are cut.

In certain examples, the determination of where the cut is made is based on certain identifying markers on the encapsulation layer, display active area, and/or substrate. An alignment marker may be disposed or positioned at the approximate location of an edge of the display active area. Alternatively, the marker may be positioned at a suggested cutting location (i.e., where there is no display active area). The marker may be made during the manufacture of the encapsulation layer, display active area, substrate, or additional layer of the display unit itself. Alternatively, the marker may be subsequently added or applied to a surface of the encapsulation layer, substrate, or additional layer of the display unit.

In certain examples, the positioning or location of the alignment marker may be based on manufacturing tolerances. In other words, the location of an outer edge of the display active area may be within a certain range based on the manufacturing process of positioning the display active area between the substrate and encapsulation layer. A marker may be applied or disposed based on this approximate location of the outer edge of the display active area. Alternatively, the display active area may be visibly identified between the substrate and encapsulation layer after manufacturing, and the marker may be positioned at a location based on this visible identification.

The display unit may be cut by any presently known or future conceivable method. In one example, the display unit is cut using a die cutting process. The die cutting may be a rotary die cutting or a flatbed die cutting. Rotary die cutting may use a cylindrical die on a rotary press. The die may be a solid engraved die, adjustable die, or magnetic plate tooling.

In other examples, a computer numerical control (CNC) cutting process is used to cut the display unit. The CNC process may use a CNC router to cut the display unit. A computer program (e.g., a computer-aided design (CAD) or computer-aided manufacturing (CAM) program) may provide a computer file that is interpreted by a processor of a computer to operate the CNC router or machine used to cut the display unit.

In yet other examples, the display unit is cut using a laser cutting process. The laser may be controlled by computer numerical control process or by an individual user (e.g., a hand-operated process). In such an example, the laser may melt part of the encapsulation layer (and substrate below) to assist in providing a sealing at the cut section of the display unit (as described in act S105 below). In other words, a portion of the encapsulation layer may be melted and used as part or all of the sealant configured to protect the display active area. In one example, the laser may melt part of the existing encapsulation layer (e.g., a consumable type of inorganic material configured to melt). In another example, an additional composition may be added to the encapsulation layer prior to or during the laser melting process in order to assist in the melting (and "cutting") of the encapsulation layer.

As noted above, this process of cutting the display unit to remove a portion of the encapsulation layer and substrate at or near an edge of the display unit is advantageous in reducing the overall size of the electronic device without reducing the size the display screen or display active area. For example, in a conventional display unit device, placement of the encapsulation layer and substrate around the display active area may add over 800-1000 micrometers to an edge of the display unit. In other words, there is a border around the display active area or an excess of at least 800-1000 micrometers of material from the edge of the display active area to the edge of the display unit. The cutting process, as disclosed herein, may remove at least portion of this border, therein reducing the size of the display unit (and electronic device) without reducing the display active area.

In some examples, the cutting may reduce the border to 50, 100, 200, 300, or 400 micrometers or less, or 1-50 micrometers, 1-100 micrometers, 100-200 micrometers, 200-300 micrometers, or 300-400 micrometers. In other words, the amount of excess material (e.g., encapsulation layer and substrate) extending from an edge of the display active area to the edge of the display unit may be reduced from, e.g., 1000 micrometers to 50, 100, 200, 300, or 400 micrometers or less, or 1-50 micrometers, 1-100 micrometers, 100-200 micrometers, 200-300 micrometers, or 300-400 micrometers.

In act S105, the cut section of the display unit is sealed. This is advantageous in protecting the now exposed display active area from external contaminants such as moisture (e.g., humidity), oxygen, dust, or chemicals (e.g., organic solvents). Additionally, this sealing process adds minimal size to the overall display unit. That is, the sealing process may add 50 micrometers or less, 100 micrometers or less, 200 micrometers or less, 1-50 micrometers, 1-100 micrometers, or 100-200 micrometers to the size (e.g., width) of the display unit. As such, the process of cutting excess encapsulation layer and substrate from an edge of the display unit and then sealing the display unit advantageously reduces the size of the display unit (and electronic device) while still protecting the display active area from external contaminants. In other words, after the cutting and the sealing, the measured distance between the edge of the display active area to the edge of the sealed display unit may be 50, 100, 200, 300, or 400 micrometers or less, or 1-50 micrometers, 1-100 micrometers, 100-200 micrometers, 200-300 micrometers, or 300-400 micrometers.

The act of sealing the cut edge may include applying a sealant to cover the opening along the cut edge between the encapsulation layer and the substrate. The sealant may be viscous material that has little or no flow characteristics such that the sealant remains where it is applied. Alternatively, the sealant may be thin and runny so as to allow the sealant to penetrate the cut area by capillary action. The sealant may be an anaerobic acrylic sealant, which may cure and harden in the absence of air. Alternatively, the sealant may be a surface sealant that requires air as part of the cure mechanism that changes state to become solid, once applied, and is used to prevent the penetration of external contaminants (e.g., air, gas, moisture, dust).

As noted above, the act of sealing may be combined with the act of cutting. This is advantageous in that the two acts are performed at the same time, therein minimizing the time of exposure of the internal display active area. Additionally, or alternatively, the process of cutting and sealing at the same time may allow for the fusing or combining of the multiple layers together at a same time. In one example, a laser may melt part of the encapsulation layer (and substrate below) to assist in sealing at least a portion of the cut section of the display unit. In other words, a portion of the encapsulation layer may be melted and used as part or all of a sealant configured to protect the display active area. For example, the sealant used to seal the cut edge may be part of the existing encapsulation layer. In another example, an additional composition may be added to the encapsulation layer prior to or during the laser melting process in order to assist in the melting (and "cutting") of the encapsulation layer, such as the sealant materials discussed below.

The sealant may include an acrylic resin, butyl rubber, epoxy resin, latex, plastic, polysulfide, polyurethane, rubber, silicone, urethane, vinylester, polyester, or any other polymer composition, or a combination thereof. In some examples, the sealant is a thermoset resin (e.g., an epoxy resin, vinylester resin, or polyester resin). In one particular example, the sealant is an epoxy resin. Examples of epoxy resin compositions include bisphenol A epoxy resins, bisphenol F epoxy resins, novolac epoxy resins, aliphatic epoxy resins, and glycidylamine epoxy resins. Any commercially available epoxy resin may be considered. In some examples, the sealant includes an active adsorbent compound configured to adsorb moisture or oxygen. The adsorbent may be a desiccant or calcium oxide, for example.

In certain examples, the sealant is cured after application, wherein the sealant polymer composition is toughened or hardened through a cross-linking of polymer chains of the sealant composition. The curing may be initiated through exposure to air, electron beams, heat, or chemical additives. For example, certain additives may be activated by ultraviolet radiation (e.g., a UV cure).

The sealant may be cured through an application of heat (e.g., globally or locally). The viscosity of the sealant drops initially upon the application of heat, passes through a region of maximum flow and begins to increase as the chemical reactions increase the average length and the degree of cross-linking between the constituent oligomers. This process continues until a continuous 3-dimensional network of oligomer chains is created, wherein a hardened resin is formed. In some examples, the sealant is cured through the application of heat from a laser used in the cutting process.

In another example, the act of sealing the cut edge may include positioning a transparent cover adjacent to or near the encapsulation layer to protect at least a portion of the cut edge from external contaminants. Additionally, a sealant may be applied over the remaining exposed portion of the cut edge to protect the remaining exposed portion of the cut edge.

In one example, the transparent cover may be positioned over the display unit such that the encapsulation layer is disposed between the transparent cover and the display active area. The transparent cover may only cover or protect a portion of the exposed cut edge. The sealant may be provided to cover the opening between the transparent cover and the substrate along the edge of the cut section of the display unit.

In one example, the transparent cover is disposed in a plane parallel with the substrate, and the sealant is disposed in a plane perpendicular with the transparent cover, extending between an edge of the transparent cover and an edge of the substrate to cover and seal the cut edge of the display unit.

In another example, the transparent cover includes a first section and a second section. The first and second sections may be made from a single piece of material (e.g., glass, plastic) or separate pieces of material adhered together at their adjacent ends. The first section of the transparent cover may be disposed in a plane parallel with the substrate and the second section may be disposed in a plane perpendicular with the first section. The second section may be positioned adjacent to the cut section of the display unit to at least partially cover and seal the cut edge. A sealant may be applied to the remaining exposed area of the cut edge to cover and seal the cut edge. For example, the sealant may be disposed along a plane parallel with the first section of the transparent cover, connecting the second section of the transparent cover and the substrate.

The transparent cover may include or be composed of glass, plastic, and/or other transparent materials that permit a user of the electronic device to view images created by the display unit. The transparent cover may be made of a single piece of material (e.g., glass, plastic) or multiple pieces of material that are adhered together.

In certain examples, additional layers or components may be disposed between the transparent cover and the encapsulation layer prior to applying the transparent cover and/or sealant to seal the cut edge. For example, an adhesive layer may be positioned between the transparent cover and encapsulation layer in order to secure the two layers together. As noted above, the adhesive layer may include one or more pressure-sensitive adhesive materials. Additional or alternative types of adhesive materials and films may be used, including, for instance, moisture or thermally cured adhesive materials. The adhesive materials of the adhesive layer may be silicone-based, epoxy-based and/or acrylic-based materials.

In some examples, a touch sensor unit may be disposed between the transparent cover and encapsulation layer, such as in the case of a tablet computer or mobile phone, therein allowing a user to touch the transparent cover and provide input for the electronic device. The touch sensor layer may be securely positioned between the adjacent layers with one or more adhesive layers. The touch sensor unit may be made of any known or future developed material. In certain examples, the touch sensor unit may be made from indium tin oxide (ITO), metal mesh, carbon nanotubes, and combinations thereof.

As noted above, more than one section or edge of the display unit may be cut and removed from the display unit. Each cut edge may be subsequently sealed. A same or different sealing process may be implemented on each cut edge.

Figure 2:
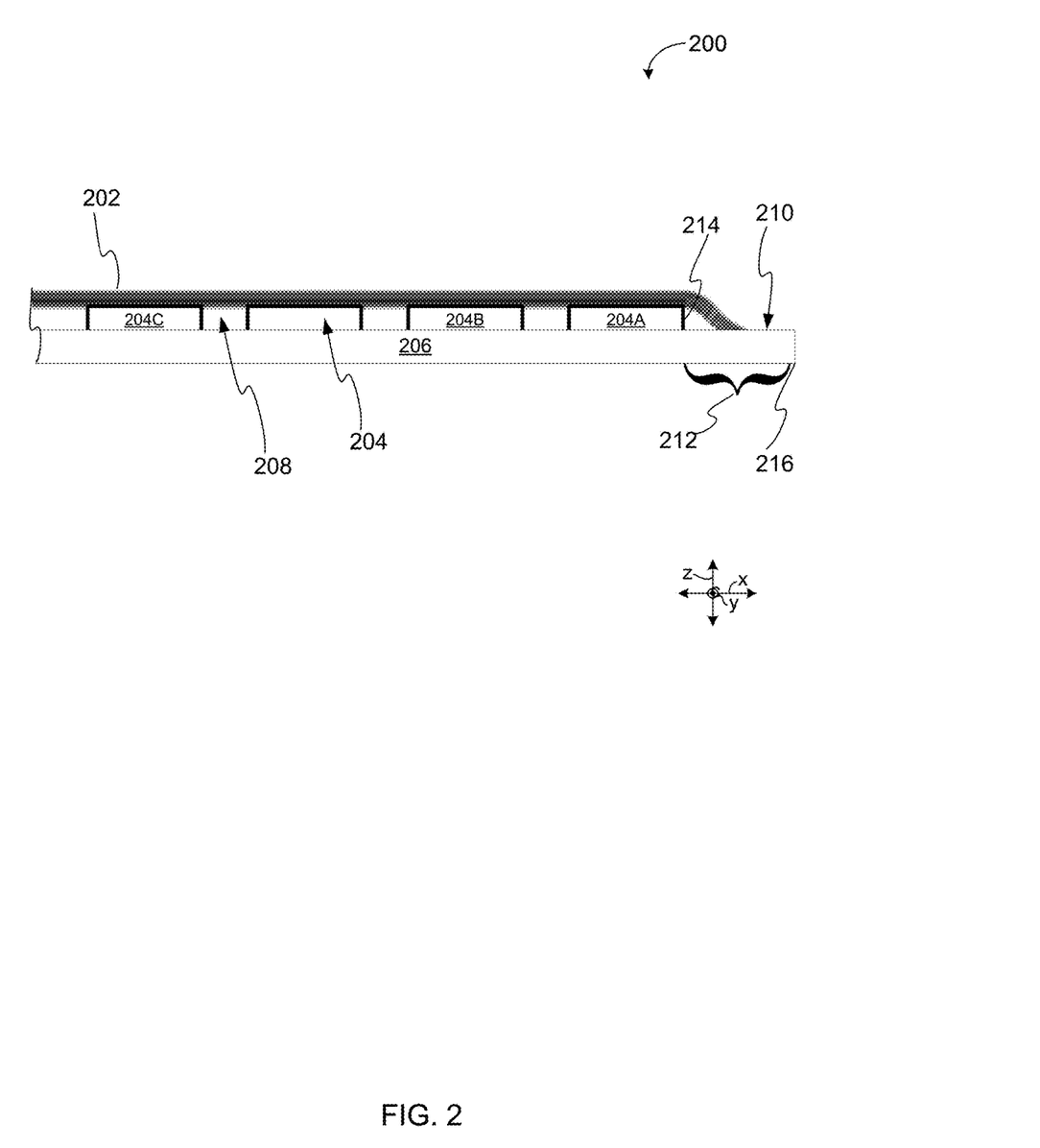
FIG. 2 depicts an example of a display unit of an electronic device, the display unit having an encapsulation layer, a display active area, and a substrate.

FIG. 2 depicts an example of a display unit 200 that has not been modified (e.g., cut or sealed). In this example, the display unit 200 includes an encapsulation layer 202, a display active area 204, and a substrate 206. The display active area includes a plurality of active areas 204A, 204B, 204C. Each active area may include a pixel array of a LED or LCD display. Openings 208 may be present in the display active area 204 between the pixel arrays, wherein the openings have no pixels.

At or near one end or edge 210 of the display unit 200, the encapsulation layer 202 is attached and secured to the substrate 206, therein covering and securing the display active area 204. As depicted in FIG. 2, this connection of encapsulation layer with the substrate provides a border 212 around at least a portion of the display unit having no display active area. As depicted in FIG. 2, the border 212 adds size (e.g., width or length) in the x-direction to the overall display unit 200.

The border 212, as measured from the edge 214 of the display active area 204 to the edge 216 of the display unit 200, may be 500 micrometers or greater, 600 micrometers or greater, 700 micrometers or greater, 800 micrometers or greater, 900 micrometers or greater, 1000 micrometers or greater, in a range of 500-1500 micrometers, in a range of 700-1200 micrometers, or in a range of 800-1000 micrometers.

Figure 3:
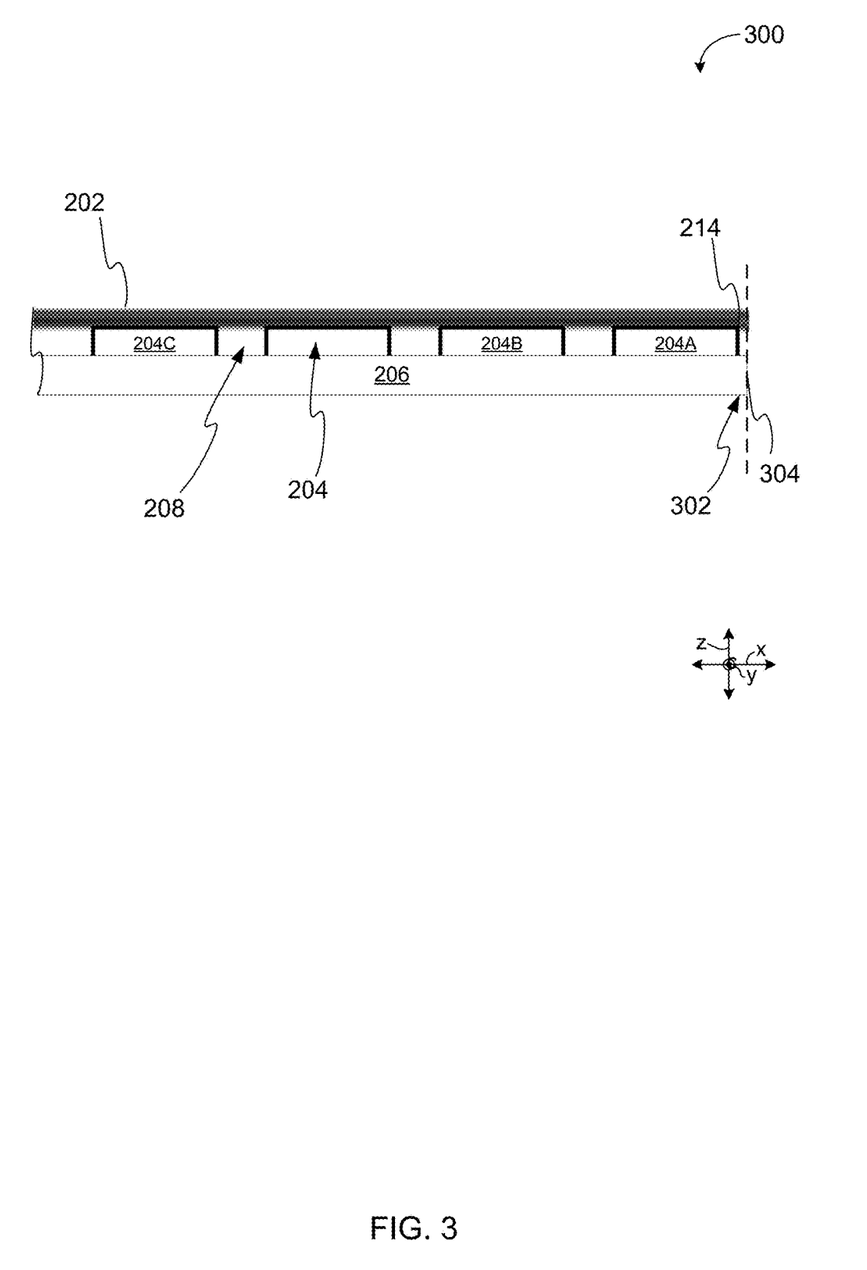
FIG. 3 depicts an example of a modified display unit of FIG. 2, wherein a section of the display unit has been cut and removed at one edge of the display unit.

FIG. 3 depicts an example of a modified display unit 300, wherein the display unit (e.g., from FIG. 2) has been cut along the dashed line, removing at least portion of the border. The cutting process may be performed as described above. As depicted in FIG. 3, the cutting and removing of a portion of the border advantageously reduces the size of the display unit 200 (and electronic device) without reducing the display active area 204.

In this example, a modified border 302 is provided. The modified or reduced border 302, as measured from the edge 214 of the display active area 204 to the cut edge 304 of the modified display unit 300, may be 200 micrometers or less, 100 micrometers or less, 50 micrometers or less, 1-50 micrometers, 1-100 micrometers, or 100-200 micrometers, for example. In other words, the amount of excess material (e.g., encapsulation layer and substrate) extending from an edge 214 of the display active area 204 to the cut edge 304 of the modified display unit 300 may be reduced from, e.g., 1000 micrometers to 200 micrometers or less, 100 micrometers or less, 50 micrometers or less, 1-50 micrometers, 1-100 micrometers, or 100-200 micrometers.

Figure 4:
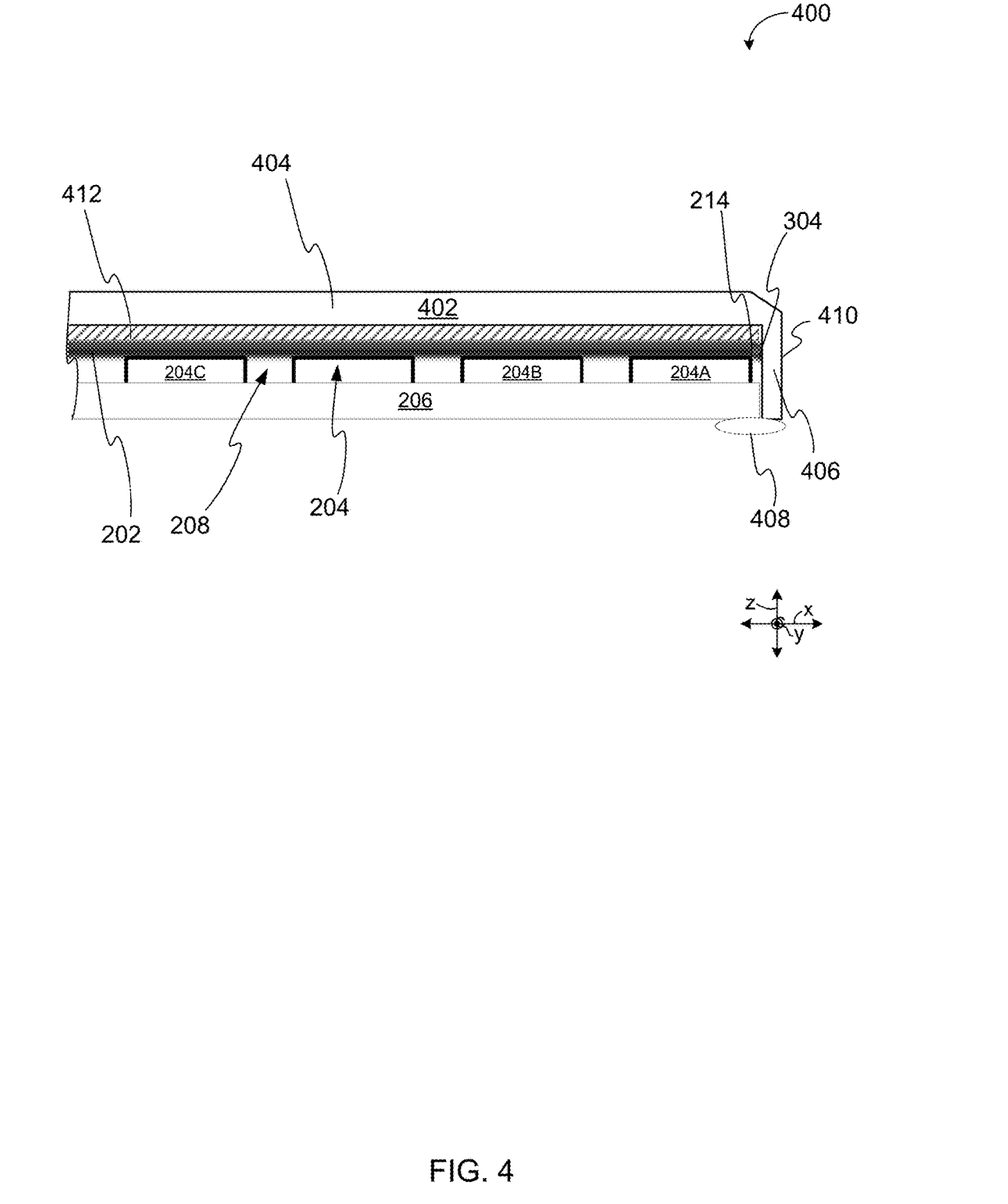
FIG. 4 depicts an example of the modified display unit of FIG. 3, wherein the cut section has been sealed by a transparent cover and sealant.

FIG. 4 depicts an example of a modified display unit 400, wherein a display unit (e.g., from FIG. 3) having a cut edge 304 been sealed along the cut edge 304 to protect the display active area 204. In this example, a transparent cover 402 is provided such that the encapsulation layer 202 is disposed between the transparent cover 402 and the display active area 204. As noted above, the transparent cover 402 may include or be composed of glass, plastic, and/or other transparent materials that permit a user of the electronic device to view images created by the display unit.

In this depicted example, the transparent cover includes a first section 404 and a second section 406. The first section 404 and the second section 406 may be made from a single piece of material, wherein the piece of material has been molded to fit around the cut edge. The first section 404 of the transparent cover 402 is disposed in the x-y plane, parallel with the substrate, and the second section 406 is disposed in the y-z plane perpendicular with the first section 404 and x-y plane. The second section 406 is positioned adjacent to the cut edge 304 of the display unit 400 to at least partially cover the cut edge 304.

Additionally, a sealant 408 is provided to cover the remaining exposed area of the cut edge 304, therein sealing the cut edge 304. In this depicted example, the sealant 408 is disposed in the x-y plane parallel with the first section 404 of the transparent cover 402, connecting the second section 406 of the transparent cover 402 and the substrate 206.

The width or length of the second section 406 of the transparent cover 402 (as measured in the x-direction) may be 100 micrometers or less, 200 micrometers or less, 300 micrometers or less, 400 micrometers or less, 500 micrometers or less, 1-100 micrometers, 100-200 micrometers, 200-300 micrometers, 300-400 micrometers, or 400-500 micrometers. As such, after the cutting and the sealing, the measured distance between the edge 214 of the display active area 204 to the edge 410 of the sealed display unit may be 500 micrometers or less, 400 micrometers or less, 300 micrometers or less, 200 micrometers or less, 100 micrometers or less, 400-500 micrometers, 300-400 micrometers, 200-300 micrometers, 100-200 micrometers, or 50-100 micrometers.

As depicted in FIG. 4, additional layers or components may be disposed between the transparent cover 402 and the encapsulation layer 202 prior to applying the transparent cover 402 and/or sealant 408 to seal the cut edge 304. For example, a touch sensor unit 412 may be disposed between the transparent cover 402 and encapsulation layer 202. The touch sensor unit 412 may be securely positioned between its adjacent layers with one or more adhesive layers.

Figure 5:
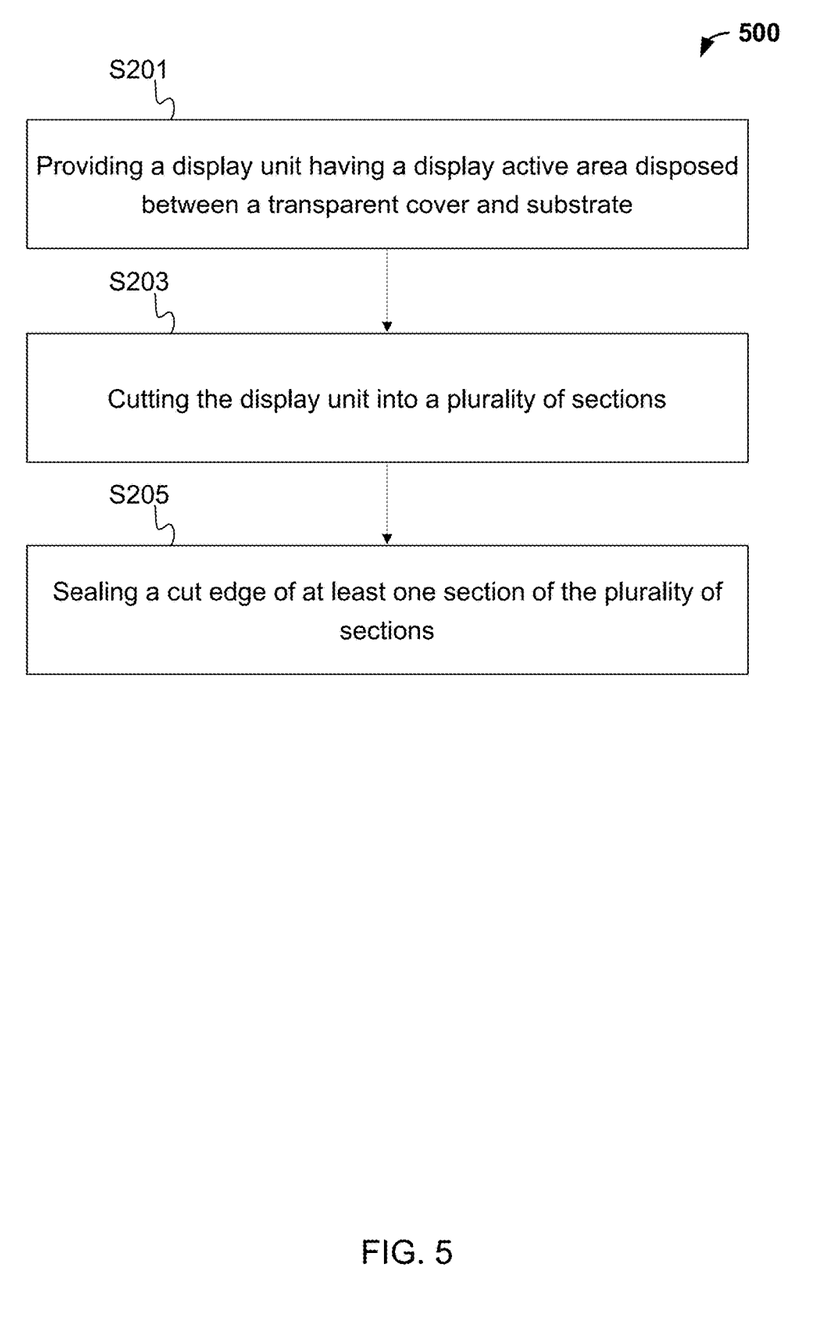
FIG. 5 depicts an additional example flowchart for reducing a border of an electronic device.

FIG. 5 depicts an additional example flowchart for reducing a border of an electronic device. In act S201, a display unit of an electronic device is provided. The display unit may include a display active area disposed between a transparent cover and a substrate. The display active area may include a light emitting diode (LED) unit, an organic light emitting diode (OLED) unit, or a liquid crystal display (LCD) unit and backlight unit.

In this example, a transparent cover is disposed adjacent to one surface of the display active area prior to any cutting or sealing acts. This may be advantageous in manufacturing an entire display module prior to cutting or sealing. For example, the display unit may be a touch display module having a touch display unit disposed between the transparent cover and display active area.

The transparent cover is configured to enclose or cover the display active area between a surface (e.g., an internal surface) of the transparent cover and a surface (e.g., an internal surface) of the substrate. This is advantageous in providing a barrier for the display active area, therein protecting the display active area from external contaminants such as moisture (e.g., humidity), oxygen, dust, or chemicals (e.g., organic solvents).

The transparent cover may include or be composed of glass, plastic, and/or other transparent materials that permit a user of the electronic device to view images created by the display unit. The transparent cover may be made of a single piece of material (e.g., glass, plastic) or multiple pieces of material that are adhered together.

The substrate may be disposed in a plane parallel with the transparent cover to sandwich or protect the display active area in between the transparent cover and substrate. Like the transparent cover, the substrate may be made of a composition configured to protect the display active area from external contaminants. The substrate may be made of a similar or different composition from the transparent cover. In certain examples, the substrate composition is a glass, plastic, or polymer. The substrate may also be configured to support the display active area. In such examples, the substrate may be a rigid composition.

In certain examples, additional layers or components may be disposed between the transparent cover and the display active area prior to cutting the display unit and/or sealing the cut edge. For example, an adhesive layer may be positioned between the transparent cover and display active area in order to secure the two layers together or to secure the transparent cover or display active area to an adjacent intermediate layer or component. As noted above, the adhesive layer may include one or more pressure-sensitive adhesive materials. Additional or alternative types of adhesive materials and films may be used, including, for instance, moisture or thermally cured adhesive materials. The adhesive materials of the adhesive layer may be silicone-based, epoxy-based and/or acrylic-based materials.

In some examples, a touch sensor unit may be disposed between the transparent cover and display active area, such as in the case of a tablet computer or mobile phone, therein allowing a user to touch the transparent cover and provide input for the electronic device. The touch sensor unit may be securely positioned between the adjacent layers with one or more adhesive layers.

Internal electronics components may be disposed between the display unit and substrate, or may be disposed between the substrate layer and an external backing layer). The internal electronics components may include one or more of the following: a touch sensor unit, a vapor chamber, heat pipe, heat sink, heat fin, battery, processor, integrated circuit, or printed circuit board. As noted above, the touch sensor unit may be made of any known or future developed material. In certain examples, the touch sensor unit may be made from indium tin oxide (ITO), metal mesh, carbon nanotubes, and combinations thereof.

In act S203, the display unit is cut into a plurality of sections. The cutting may be conducted between pixels or sections of the display active area. That is, the display active area may include areas without pixels. In other words, the location or locations of cutting the display unit may be determined such that no active area or pixel is damaged. This process may be advantageous in reducing the size of the display unit and overall electronic device without reducing the size of the display active area (or display screen itself), or otherwise damaging the display active area. For example, the distance between two active areas or pixel arrays may be 100, 200, 300, or 400 micrometers. The process of cutting the display device in the middle between the two pixel arrays forms two modified display devices having respective cut edges. This process may effectively reduce a distance between the edge of each pixel array or active area and the edge of the modified display device from 100, 200, 300, or 400 micrometers to 50, 100, 150, or 200 micrometers, respectively. Additionally, at least two separated modified devices have been formed with a cut edge or modified border.

Determining where the cut is made may be based on certain identifying markers on the transparent cover, display active area, substrate, and/or additional intermediate layer of the display unit. A marker may be disposed or positioned at the approximate location of an edge of the display active area. Alternatively, the marker may be positioned at a suggested cutting location (i.e., where there is no display active area). The marker may be made during the manufacture of the transparent cover, substrate, or additional layer of the display unit itself. Alternatively, the marker may be subsequently added or applied to a surface of the transparent cover, substrate, or additional layer of the display unit.

In certain examples, the positioning or location of the marker may be based on manufacturing tolerances. In other words, the location of an outer edge of the display active area may be within a certain range based on the manufacturing process of positioning the display active area between the substrate and transparent cover. A marker may be applied or disposed based on this approximate location of the outer edge of the display active area. Alternatively, the display active area may be visibly identified between the substrate and transparent cover after manufacturing, and the marker may be positioned at a location based on this visible identification.

As discussed above, the display unit may be cut by using a die cutting process (e.g., a rotary die cutting or a flatbed die cutting), a computer numerical control (CNC) cutting process, a laser cutting process, or any other known or future developed cutting process.

The number of sections into which display unit may be cut is variable. In some examples, the display unit may be cut into two or more (e.g., 2, 3, 4, 5, and so on) identically sized sections. In another example, the display unit may be cut into two or more variably sized sections.

In act S205, a cut edge of at least one section of the plurality of sections is sealed. As noted above, this is advantageous in protecting the exposed display active area from external contaminants such as moisture (e.g., humidity), oxygen, dust, or chemicals (e.g., organic solvents). Additionally, this sealing process adds minimal size to the overall display unit. That is, the sealing process may add 50 micrometers or less, 100 micrometers or less, 200 micrometers or less, 1-50 micrometers, 1-100 micrometers, or 100-200 micrometers to the size (e.g., width) of the display unit. As such, the process of cutting the transparent cover and substrate between pixel arrays of the display active area and then sealing the display unit advantageously reduce the size of the display units (and electronic devices) while still protecting the display active areas from external contaminants. In other words, after the cutting and the sealing, the measured distance between the edge of a pixel array of the display active area to the edge of the sealed display unit may be 200 micrometers or less, 100 micrometers or less, 50 micrometers or less, 1-50 micrometers, 1-100 micrometers, or 100-200 micrometers, for example.

The act of sealing the cut edge may include applying a sealant to cover the opening along the cut edge between the transparent cover and the substrate. A first section of sealant may be applied along the plane in which the cut was performed. Additionally, in certain examples, a second section of sealant may be applied in a plane perpendicular to the cut plane. For instance, the second section of sealant may be applied between the substrate and first section of sealant.

Examples of sealants and processes of application are discussed above. In one particular example, the sealant is an epoxy resin (e.g., a bisphenol A epoxy resin, bisphenol F epoxy resin, novolac epoxy resin, aliphatic epoxy resin, glycidylamine epoxy resin, or a combination thereof). Any commercially available epoxy resin may be considered.

The sealant may be cured through an application of heat. The viscosity of the sealant drops initially upon the application of heat, passes through a region of maximum flow and begins to increase as the chemical reactions increase the average length and the degree of cross-linking between the constituent oligomers. This process continues until a continuous 3-dimensional network of oligomer chains is created, wherein a hardened resin is formed between the transparent cover and substrate.

Upon applying and curing the sealant, a plurality of modified display units may be formed from a larger display unit or a plurality of larger display units. This may be advantageous in forming a multi-screen display, wherein two or more modified display units are joined together at their cut and sealed edges. This arrangement may be advantageous in initially manufacturing a large display unit, cutting the display unit into a plurality of smaller segments, sealing those segments along their cut edges, and then shipping the smaller segments to an end-user for reassembly. This process is advantageous in reducing the complexity and difficulty in shipment of a large electronic display device by dividing the shipment into a plurality of smaller, more manageable segments.

Figure 6:
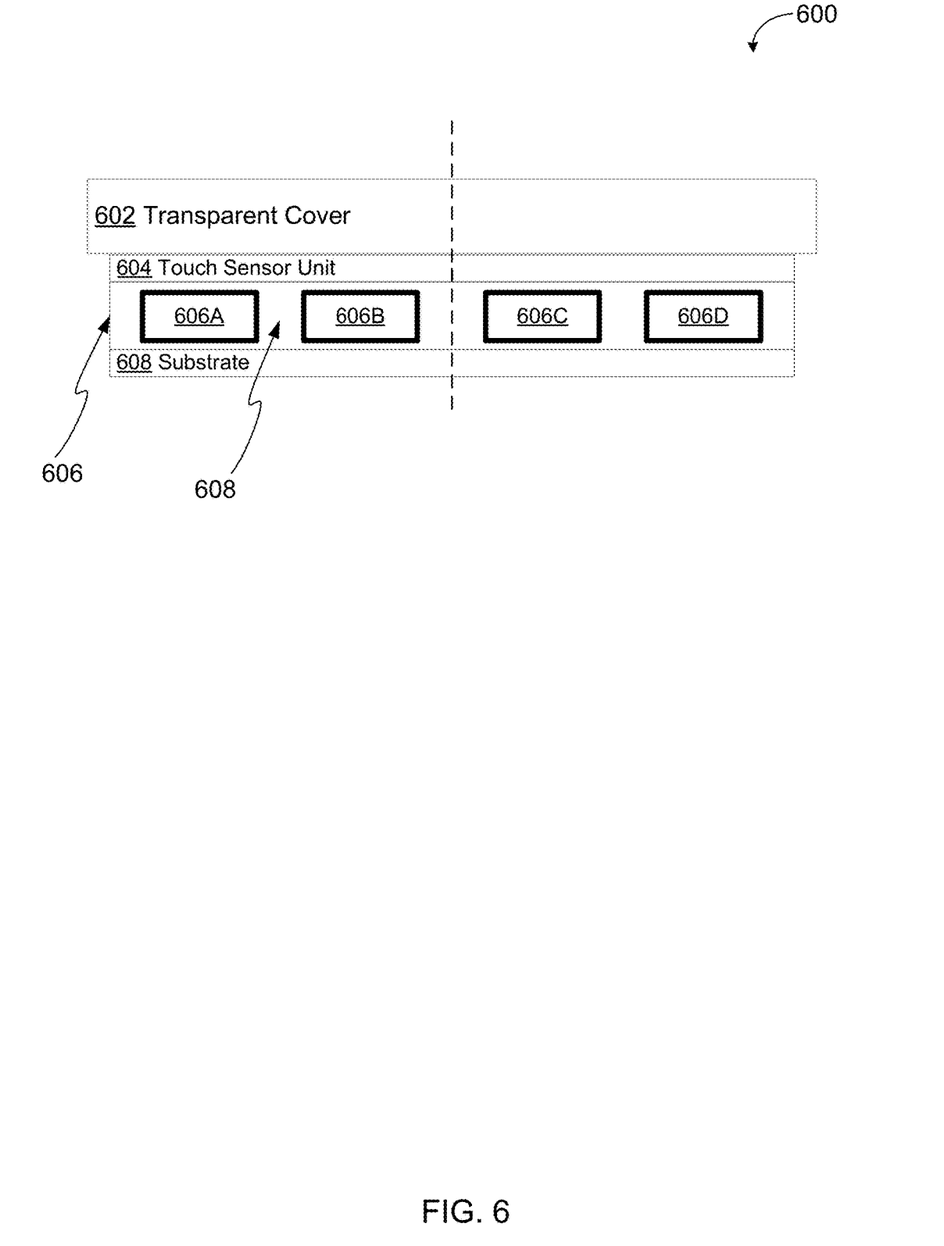
FIG. 6 depicts an example of a display unit of an electronic device having a display active area disposed between a transparent cover and substrate.

FIG. 6 depicts an example of a display unit 600 of an electronic device that has not been modified (e.g., cut or sealed). The display unit 600 includes a transparent cover 602, a touch sensor unit 604, a display active area 606, and a substrate 608. The display active area 606 includes a plurality of active areas 606A, 606B, 606C, 606D. Each active area may include a pixel array of a LED or LCD display. Openings 610 may be present in the display active area 606 between the pixel arrays, wherein the openings have no pixels. A dashed line represents the location of where the display unit 600 will be cut.

Figure 7A:
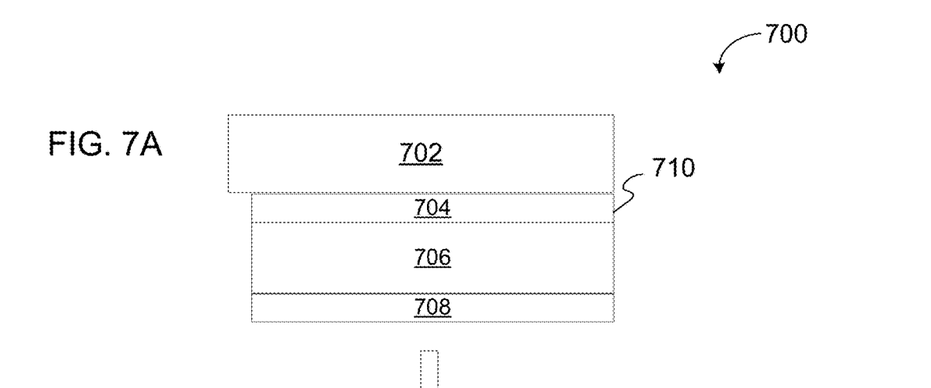
FIG. 7A depicts an example of one section of the display unit of FIG. 6, wherein the display unit of FIG. 6 has been cut into a plurality of sections.

FIG. 7A depicts an example of a modified display unit 700, wherein the display unit from FIG. 6 has been cut along the dashed line, therein providing a display unit with a cut edge 710. The modified display unit 700 includes a modified transparent cover 702, touch sensor unit 704, display active area 706, and substrate 708. The cutting process may be performed as described above. As depicted in FIG. 7A, the cutting of the display unit 600 of FIG. 6 into two segments between pixel arrays of the display active area advantageously reduces the size of the display unit 700 (and electronic device).

Figure 7B:
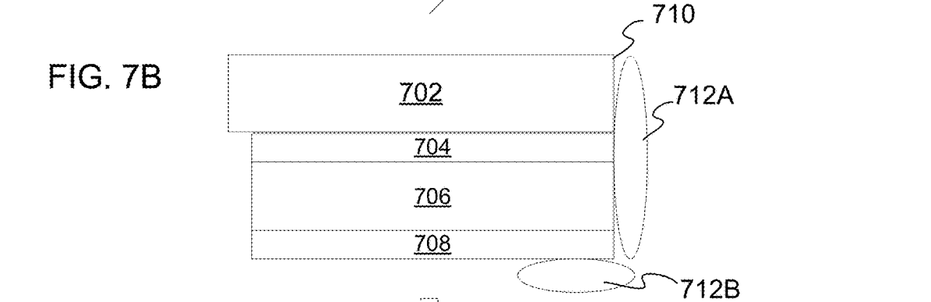
FIG. 7B depicts an example of a sealant applied to the cut edge of the modified display unit of FIG. 7A.

FIG. 7B depicts an example of a sealant 712A, 712B applied to the cut edge 702 of the modified display unit of FIG. 7A. The sealant 712A, 712B has been applied along the cut edge 702 to protect the display active area 706. In this example, a first section of sealant 712A is applied along the y-z plane in which the cut was performed. Additionally, a second section of sealant 712B is applied in the x-y plane, perpendicular to the y-z plane. The second section of sealant 712B is applied between the substrate 708 and first section of sealant 712A.

Figure 7C:
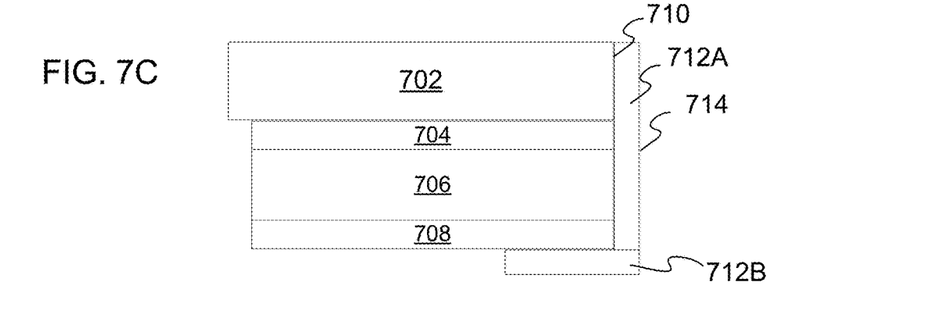
FIG. 7C depicts an example of a cured sealant of the modified display unit of FIG. 7B.

FIG. 7C depicts an example of a cured sealant of the modified display unit of FIG. 7B. Following application of a viscous sealant, the sealant 712A, 712B may undergo a curing process, wherein the sealant polymer composition is toughened or hardened through a cross-linking of polymer chains of the sealant composition. The curing may be initiated through exposure to air, electron beams, heat, or chemical additives.

Following the curing of the sealant, the width or length of the first section of sealant 712A (as measured in the x-direction) may be 50 micrometers or less, 100 micrometers or less, 200 micrometers or less, 1-50 micrometers, 1-100 micrometers, or 100-200 micrometers. As such, after the cutting, sealing, and curing, the measured distance between the edge of a pixel array of the display active area 706 to the edge 714 of the sealed display unit may be 200 micrometers or less, 100 micrometers or less, 50 micrometers or less, 1-50 micrometers, 1-100 micrometers, or 100-200 micrometers.

Figure 8:
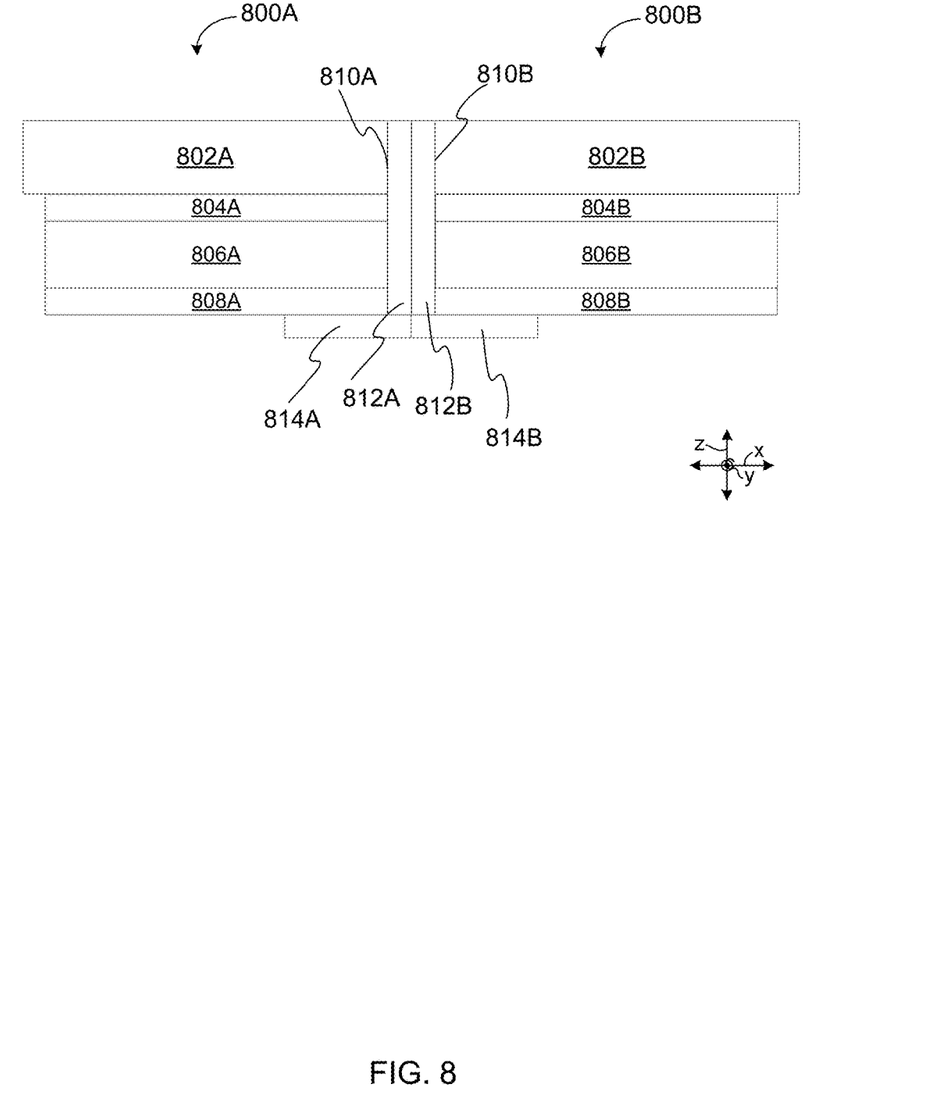
FIG. 8 depicts an example of two modified display units positioned adjacent to each other at their respective cut and sealed edges.

FIG. 8 depicts an example of two modified display units 800A, 800B positioned adjacent to each other at their respective cut and sealed edges. A first modified display unit 800A includes a modified transparent cover 802A, touch sensor unit 804A, display active area 806A, and substrate 808A. The display unit 800A has been cut from a larger display unit along one edge 810A. A first section 812A and a second section 814A of a sealant have been applied and cured at the cut edge 810A.

A second modified display unit 800B has also been cut from a larger display unit along an edge 810B. In some examples, the larger display unit is the same display unit used to form the first modified display unit. In one particular example, the first and second modified display units share a cut edge from the larger display unit. In other examples, the first and second modified display units are formed from different cut edges of a same larger display unit, or they are formed from different cut edges of different display units.

Like the first modified display unit, the second modified display unit 800B includes a modified transparent cover 802A, touch sensor unit 804A, display active area 806A, and substrate 808A. A first section 812B and a second section 814B of a sealant have been applied and cured at the cut edge 810B of the second modified display unit 800B.

As depicted in FIG. 8, the two modified display units 800A, 800B are positioned adjacent to each other to form a larger shared display. As noted above, each individual sealing process may add 50 micrometers or less, 100 micrometers or less, 200 micrometers or less, 1-50 micrometers, 1-100 micrometers, or 100-200 micrometers to the size (e.g., width) of each modified display unit. As such, the combined distance, as measured in the x-direction, between the edges of the display active areas of the two joined display units may be double the distance for each individual display unit. That is, the distance between the two active display areas may be 100 micrometers or less, 200 micrometers or less, 400 micrometers or less, 1-100 micrometers, 100-200 micrometers, or 200-400 micrometers, for example.

As noted above, this arrangement may be advantageous in initially manufacturing a large display unit, cutting the display unit into a plurality of smaller segments, sealing those segments along their cut edges, and then shipping the smaller segments to an end-user for reassembly. This process is advantageous in reducing the complexity and difficulty in shipment of a large electronic display device by dividing the shipment into a plurality of smaller, more manageable segments.

Figure 9:
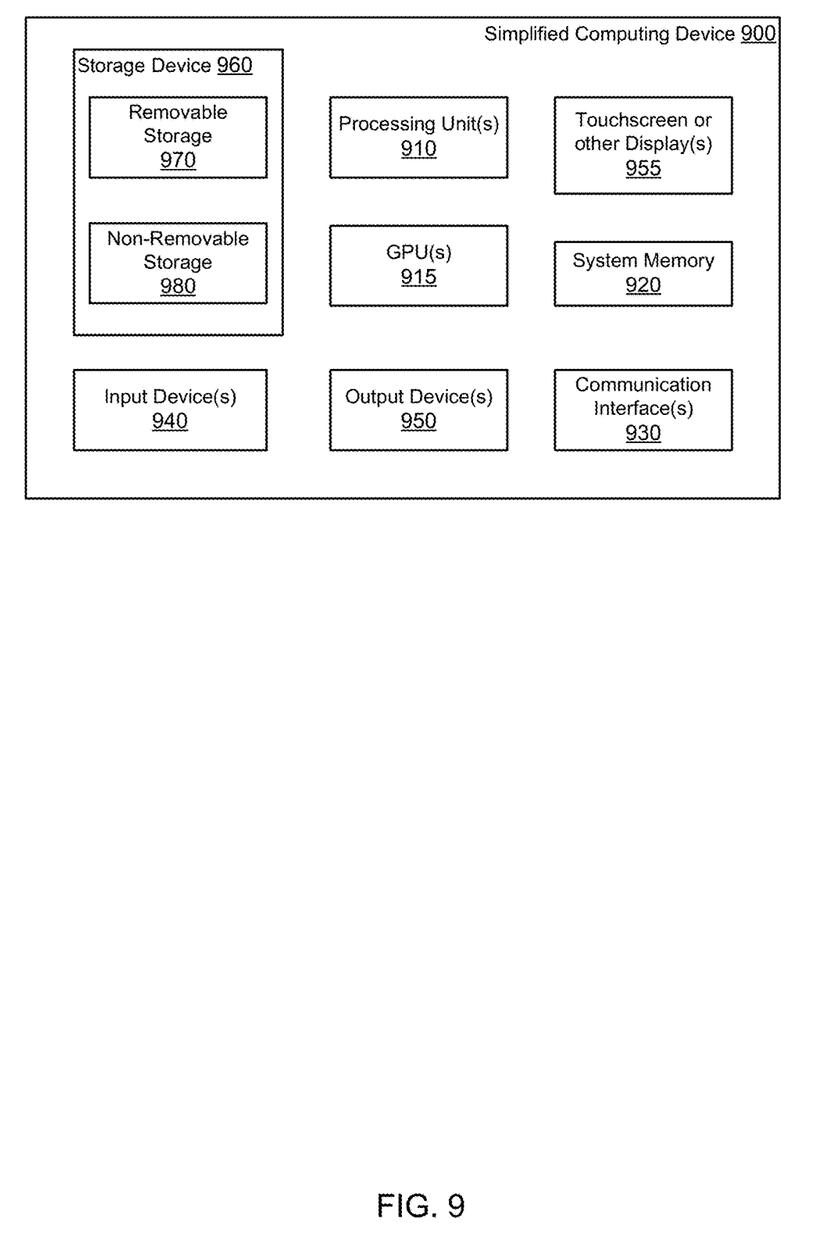
FIG. 9 is a block diagram of a computing environment in accordance with one example for implementation of the disclosed methods or one or more heat dissipation apparatuses.

With reference to FIG. 9, the display layer as described above may be incorporated within an exemplary electronic device or computing environment 900. The computing environment 900 may correspond with one of a wide variety of computing devices, including, but not limited to, any other electronic device having a display screen such as a television, computer monitor, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the computing environment 900 is a wearable electronic device, wherein the device may be worn on or attached to a person's body or clothing.

The computing environment 900 has sufficient computational capability and system memory to enable basic computational operations. In this example, the computing environment 900 includes one or more processing unit(s) 910, which may be individually or collectively referred to herein as a processor. The computing environment 900 may also include one or more graphics processing units (GPUs) 915. The processor 910 and/or the GPU 915 may include integrated memory and/or be in communication with system memory 920. The processor 910 and/or the GPU 915 may be a specialized microprocessor, such as a digital signal processor (DSP), a very long instruction word (VLIW) processor, or other microcontroller, or may be a general purpose central processing unit (CPU) having one or more processing cores. The processor 910, the GPU 915, the system memory 920, and/or any other components of the computing environment 900 may be packaged or otherwise integrated as a system on a chip (SoC), application-specific integrated circuit (ASIC), or other integrated circuit or system.

The computing environment 900 may also include other components, such as, for example, a communications interface 930. One or more computer input devices 940 (e.g., pointing devices, keyboards, audio input devices, video input devices, haptic input devices, or devices for receiving wired or wireless data transmissions) may be provided. The input devices 940 may include one or more touch-sensitive surfaces (e.g., track pads). Various output devices 950, including touchscreen or touch-sensitive display(s) 955, may also be provided. The output devices 950 may include a variety of different audio output devices, video output devices, and/or devices for transmitting wired or wireless data transmissions.

The computing environment 900 may also include a variety of computer readable media for storage of information such as computer-readable or computer-executable instructions, data structures, program modules, or other data. Computer readable media may be any available media accessible via storage devices 960 and includes both volatile and nonvolatile media, whether in removable storage 970 and/or non-removable storage 980. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by the processing units of the computing environment 900.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, a method of reducing a border of an electronic device comprises: providing a display unit of the electronic device, the display unit having a display active area disposed between an encapsulation layer and a substrate such that the encapsulation layer encloses the display active area between a surface of the encapsulation layer and a surface of the substrate; cutting a section of the display unit at one edge of the display unit such that a portion of the encapsulation layer and a portion of the substrate are removed from the display unit while no display active area is removed; and sealing the cut section of the display unit.

In a second embodiment, a method of reducing a border of an electronic device comprises: providing a display unit of the electronic device having a display active area disposed between a transparent cover and a substrate; cutting the display unit into a plurality of sections between pixels of the display active area, each section having at least one cut edge; and sealing a cut edge of at least one section of the plurality of sections.

In a third embodiment, with reference to the first or second embodiment, the display active area comprises a light emitting diode (LED) unit or a liquid crystal display (LCD) and backlight unit.

In a fourth embodiment, with reference to any of embodiments 1-3, the cutting comprises die cutting, computer numerical control (CNC) cutting, or laser cutting.

In a fifth embodiment, with reference to any of embodiments 1, 3, or 4, the sealing comprises: placing a transparent cover over the display unit such that the encapsulation layer is disposed between the transparent cover and the display active area, and applying a sealant to cover an opening between the transparent cover and the substrate along the edge of the cut section of the display unit.

In a sixth embodiment, with reference to the fifth embodiment, the transparent cover comprises a first section and a second section, the first section disposed in a plane parallel with the encapsulation layer and the second section disposed along the cut section of the display unit in a plane perpendicular with the first section.

In a seventh embodiment, with reference to any of embodiments 1-6, a distance between an edge of the display active area and the edge of the cut section of the display unit is 200 micrometers or less.

In an eighth embodiment, with reference to any of embodiments 1-6, a distance between a pixel of the display active area and the cut edge of the at least one section is 100 micrometers or less.

In a ninth embodiment, with reference to any of embodiments 1-8, the method further comprises cutting at least one additional section of the display unit at a respective edge of the display unit such that an additional respective portion of the encapsulation layer and a portion of the substrate are removed from the display unit while no display active area is removed; and sealing the at least one additional cut section of the display unit.

In a tenth embodiment, with reference to any of embodiments 1-9, the cutting comprises laser cutting and at least a portion of the encapsulation layer is melted during the laser cutting and used as a sealant to cover an opening between the transparent cover and the substrate along the edge of the cut section of the display unit, such that the cutting and the sealing are performed simultaneously.

In an eleventh embodiment, with reference to any of embodiments 1-10, the method further comprises, prior to cutting the display unit, marking the display unit with an alignment mark to identify a location for cutting the display unit into the plurality of sections.

In a twelfth embodiment, with reference to any of embodiments 1-11, the sealing comprises applying a sealant to cover an opening along the cut edge of the at least one section between the transparent cover and the substrate.

In a thirteenth embodiment, with reference to any of embodiments 1-12, the method further comprises forming a multi-screen display by adjoining at least two sections of one or more electronic devices at their respectively sealed cut edges.

In a fourteenth embodiment, an electronic device comprises a transparent cover; a substrate; and a display unit disposed between the transparent cover and the substrate, the display unit having a display active area and at least one cut edge configured to minimize a distance between the display active area of the at least one cut edge, wherein the at least one cut edge is sealed with a sealant.

In a fifteenth embodiment, with reference to the fourteenth embodiment, the display active area comprises a light emitting diode (LED) unit or a liquid crystal display (LCD) and backlight unit.

In a sixteenth embodiment, with reference to the fourteenth or fifteenth embodiment, the transparent cover is disposed in a plane parallel with the substrate, and the sealant is disposed in a plane perpendicular with the transparent cover, extending between an edge of the transparent cover and an edge of the substrate and covering the cut edge of the display unit.

In a seventeenth embodiment, with reference to any of embodiments 14-16, the transparent cover comprises a first section and a second section, the first section disposed in a plane parallel with the substrate and the second section disposed along the cut section of the display unit in a plane perpendicular with the first section, and the sealant is disposed along a plane parallel with the first section of the transparent cover, connecting the second section of the transparent cover and the substrate.

In an eighteenth embodiment, with reference to any of embodiments 14-17, a distance between an edge of the display active area and the cut edge of the display unit is 200 micrometers or less, or 100 micrometers or less.

In a nineteenth embodiment, with reference to any of embodiments 14-18, the at least one cut edge comprises a plurality of cut edges, and each cut edge of the plurality of cut edges is sealed with the sealant.

What is claimed is:

1. A method of reducing a border of an electronic device, the method comprising:
   providing a display unit of the electronic device, the display unit having a display active area disposed between an encapsulation layer and a substrate having an inner surface and an outer surface, wherein the encapsulation layer encloses the display active area between a surface of the encapsulation layer and the inner surface of the substrate;
   cutting a section of the display unit at one edge of the display unit such that a portion of the encapsulation layer and a portion of the substrate are removed from the display unit while no display active area is removed;

placing a transparent cover over the display unit, the transparent cover having a first section and a second section, wherein the first section of the transparent cover is disposed in a plane parallel with the encapsulation layer such that the encapsulation layer is disposed between the first section of the transparent cover and the display active area, and wherein the second section of the transparent cover is disposed along the cut section of the display unit in a plane perpendicular with the first section; and applying a sealant to cover an opening between the second section of the transparent cover and the outer surface of the substrate at the edge of the cut section of the display unit, wherein the sealant is positioned along a plane parallel with the first section of the transparent cover.

2. The method of claim 1, wherein the display active area comprises a light emitting diode (LED) unit or a liquid crystal display (LCD) and backlight unit.

3. The method of claim 1, wherein the cutting comprises die cutting.

4. The method of claim 1, wherein a distance between an edge of the display active area and the edge of the cut section of the display unit is 200 micrometers or less.

5. The method of claim 1, further comprising:
cutting at least one additional section of the display unit at a respective edge of the display unit such that an additional respective portion of the encapsulation layer and a portion of the substrate are removed from the display unit while no display active area is removed; and sealing the at least one additional cut section of the display unit.

6. The method of claim 1, wherein the cutting comprises laser cutting and at least a portion of the encapsulation layer is melted during the laser cutting and used as a sealant to cover an opening between a transparent cover and the substrate along the edge of the cut section of the display unit, such that the cutting and the sealing are performed simultaneously.

7. The method of claim 1, wherein the transparent cover comprises a glass or a plastic composition.

8. The method of claim 1, wherein the sealant comprises an acrylic resin, butyl rubber, epoxy resin, latex, plastic, polysulfide, polyurethane, rubber, silicone, urethane, vinylester, polyester, or a combination thereof.

9. The method of claim 1, further comprising:
heating the applied sealant, therein curing the applied sealant.

10. The method of claim 1, wherein the cutting comprises computer numerical control (CNC) cutting.

11. The method of claim 1, wherein the cutting comprises laser cutting.

* * * * *